United States Patent
Teer et al.

(10) Patent No.: US 6,423,419 B1
(45) Date of Patent: Jul. 23, 2002

(54) MOLYBDENUM-SULPHUR COATINGS

(75) Inventors: Dennis Gerald Teer, Shrawley; Victor Bellido-Gonzalez, Halesowen; Joanne Helen Hampshire, Kidderminster, all of (GB)

(73) Assignee: Teer Coatings Limited, Worcestershire (GB)

( * ) Notice: Subject to any disclaimer, the term of this patent is extended or adjusted under 35 U.S.C. 154(b) by 0 days.

(21) Appl. No.: 09/165,030

(22) Filed: Oct. 2, 1998

Related U.S. Application Data

(63) Continuation-in-part of application No. 08/683,322, filed on Jul. 18, 1996, now abandoned.

(30) Foreign Application Priority Data

Jul. 19, 1995 (GB) .............................................. 9514773

(51) Int. Cl.[7] .............................................. B32B 15/04
(52) U.S. Cl. ........................ 428/469; 428/472; 428/697; 428/698; 428/699; 51/297; 420/429; 75/231
(58) Field of Search ............................ 51/297; 428/681, 428/655, 469, 472, 472.1, 693, 697, 698, 699, 651, 660, 665, 677; 420/429; 75/231

(56) References Cited

U.S. PATENT DOCUMENTS

| 3,294,669 A | | 12/1966 | Theuerer |
| 3,479,289 A | * | 11/1969 | Wyk |
| 4,062,319 A | | 12/1977 | Roth et al. |
| 4,261,741 A | * | 4/1981 | Terrat |
| 4,424,101 A | | 1/1984 | Nowicki |

(List continued on next page.)

FOREIGN PATENT DOCUMENTS

| CA | 2 078 245 | 3/1993 |
| DE | 35 16 933 | 11/1986 |
| DE | 202 898 | 10/1993 |
| DE | 44 14 051 | 7/1995 |
| EP | 0 198 459 | 10/1986 |
| EP | 0 409 451 | 7/1990 |
| EP | 0 534 905 | 3/1993 |
| EP | 0 562 400 | 9/1993 |
| FR | 2 586 430 | 2/1987 |
| GB | 2 199 593 | 7/1988 |
| GB | 2 228 268 | 8/1990 |
| WO | 91/14797 | 10/1991 |
| WO | 92/01081 | 1/1992 |

OTHER PUBLICATIONS

Adibi et al., "Design and characterization of a compact two–target ultrahigh vacuum magnetron sputter deposition system: Application to the growth of epitaxial $Ti_{1-x}Al_xN$ alloys and $TiN/Ti1-xAl_xN$ superlattices", *Journal of Vacuum Science & Technology*, vol. 11, No. 1, 136–142 (1993). No month.

Grosseau–Poussard et al., "Microstructural and tribological characterization of MoSx coatings produced by high–energy ion–beam–assisted deposition", *Thin Solid Films* vol. 244, No. 1, 52–57 (1993). No month.

(List continued on next page.)

Primary Examiner—Deborah Jones
Assistant Examiner—Jennifer McNeil
(74) Attorney, Agent, or Firm—Pennie & Edmonds LLP

(57) ABSTRACT

An unbalanced magnetron sputter ion plating system has a first magnetron with a first target of metal sulphide (e.g. $MoS_2$) and a second magnetron with a second target of metal (e.g. Titanium). In order to recover water and sulphur impurities from the surfaces of the coating chamber the metal target is energised in a pre-coating ion cleaning operation. The Titanium target remains energised during the deposition of the molybdenum-sulphur coating to produce a $Mo_xTi_yS_z$ coating where $x+y\approx1$ and $Z\approx2$. Best results are achieved if the Titanium content is about 18% or less by weight of the total coating content.

38 Claims, 11 Drawing Sheets

U.S. PATENT DOCUMENTS

| | | |
|---|---|---|
| 4,591,418 A | 5/1986 | Snyder |
| 4,704,301 A | 11/1987 | Bauer et al. |
| 4,731,172 A | 3/1988 | Adachi et al. |
| 4,940,523 A | 7/1990 | Takeshima |
| 5,002,798 A | 3/1991 | Donley et al. |
| 5,037,516 A | 8/1991 | Buck |
| 5,196,105 A | 3/1993 | Feurerstein et al. |
| 5,268,216 A | 12/1993 | Keem et al. |
| 5,282,985 A | 2/1994 | Zabinski et al. |

OTHER PUBLICATIONS

Seitzman et al., "Effects of temperature and ion–to–atom ratio on the orientation of IBAD MoS2 coatings", *Thin Solid Films* vol. 260, No. 2, 143–147 (1995). No month.

Patent Abstracts of Japan: JP 3014227, publication date Jan. 22, 1991; "Manufacture of Semiconductor Device", vol. 15, No. 130 (E–1051).

Patent Abstracts of Japan: JP 3097855, publication date Apr. 23, 1991; "Sputtering Device", vol. 15, No. 282 (C–850).

\* cited by examiner

MOLYBDENUM-SULPHUR COATINGS

This is a continuation-in-part of application Ser. No. 08/683,322 filed Jul. 18, 1996, now abandoned.

TECHNICAL FIELD

This invention relates to improvements in techniques for depositing metal-sulphur coatings, for example $MoS_2$, relates to metal-sulphur coatings with improved properties, and relates to articles coated with the new coating.

BACKGROUND ART $MoS_2$ coatings have been used as solid lubricants in a variety of applications, but mostly as coatings on bearings in aerospace applications. They are renowned for being soft and for deteriorating in water-containing atmospheres.

More recently, $MoS_2$ coatings have been used to improve the efficiency of cutting tools. (German Patents 982616, or DE 2 345 355, and 4414051 C1. U.S. patent application Ser. No. 07 946 642, and Swiss Patent Application 2893/91).

$MoS_2$ coatings can be deposited by various methods but the preferred method is sputtering. In the past $MoS_2$ coatings deposited by sputtering have been poorly adhered, of low density, and with columnar structure.

$MoS_2$ is conventionally very soft and powdery. It is most definitely not considered a hard coating. It can be scratched with a fingernail. Indeed, it is so soft that it is difficult to measure on the Vickers Hardness scale—it is right at the bottom end of the scale, and almost off the bottom end of the scale. It has a coefficient of friction that is very dependent upon humidity. In a dry atmosphere or in a vacuum it has a coefficient of friction of about 0.02. In humid atmospheres it has a higher coefficient of friction, and at atmospheric humidity it fails quickly because of the moisture in the air. This has restricted its use, for example to space-going applications where there is no water vapour present.

$MoS_2$ is so soft that it cannot be used as a coating where the load is too high (above, say, 20N a pin on disc test with a 5 mm ball as the pin).

Recent developments at Teer Coatings using Closed Field Unbalanced Magnetron Sputter Ion Plating (CFUMBSIP) have produced $MoS_2$ coatings of improved quality. In particular, the coatings are highly adherent, have a dense structure, a good wear rate, and are surprisingly hard. These coatings have the properties required for good tribological performance.

Our earlier patent application EP 0 521 045 discloses a closed field unbalanced Magnetron Sputter ion plating system suitable for performing the present invention, and its contents are hereby incorporated by reference. The reader is directed to read EP 0 521 045 A1 now to appreciate the disclosure incorporated. ("Closed Field" Magnetron Sputter Ion plating is the use of flux linking between adjacent magnetrons to provide a closed magnetic field between them, reducing the number of ionising electrons that escape from the system).

It has been found in practice that when using the sputtering method the results can be variable and that good coatings can be produced in one deposition sequence and better coatings in another deposition sequence which is intended to be identical.

We have linked some problems with variability in $MoS_2$ coatings with the condition of the coating system and the condition of the $MoS_2$ sputtering target, and in particular with the presence of contaminants in the deposition system.

Two contaminants causing problems are water vapour from the atmosphere and Sulphur which is present in the chamber from previous $MoS_2$ depositions. The source of water contamination is the humidity in the atmosphere. This can be absorbed on all surfaces within the coating chamber but in particular is readily absorbed by the $MoS_2$ sputtering target.

Sulphur may also be present in the sputtering chamber following previous coating operations and can form compounds such as $H_2S$ which also contribute to contamination. The water vapour and/or the sulphur in the sputtering chamber can cause acidic contamination on the substrate surface prior to deposition leading to coatings with poor adhesion. Water vapour and/or sulphur compounds can also cause contamination during coating. The contaminants can lead to coatings with less desirable properties. For instance brittle coatings may be deposited due to the presence of contaminants.

The aim of the present invention is to produce a better molybdenum-sulphur coating.

SUMMARY OF THE INVENTION

According to a first aspect of the invention we provide a molybdenum-sulphur low friction coating having a thickness of at least 200 nm and a substantially pore-free homogenous non-columnar structure.

This has hitherto been entirely unachievable. Molybdenum-sulphur coatings have traditionally been thought of as very, very, soft. 500VHN is harder than stainless steel. We believe that our coating may be so much harder than has previously been achieved because it does not have pores, or voids.

One of the leading works on $MoS_2$ films is by T Spalvins (see "A Review of Recent Advances in Solid Film Lubrication" by T Spalvins published in J Vac Sci Technol A5(2) March/April 1987). As described by Spalvins an $MoS_2$ coating has an equiaxed structure overlapping a ridge-type structure. If the thickness of the equiaxed region is greater than about 200 nm it transforms above 200 nm into a columnar fibre structure with growth structure defined by voided boundaries, or pores. The equiaxed structure extending for perhaps up to 200 nm is pore free and is a densely packed structure, but above that fibres of a columnar structure grow, extending perpendicular to the substrate and are separated by open voided boundaries A few tens of nanometres wide. Such coatings are notoriously soft and break at the fibrous columnar region. FIG. 9 illustrates this hole-filled columnar structure.

The above is discussed in U.S. Pat. No. 5,268,216 of Keem et al who propose having multiple thin (less than 200 nm) layers of $MoS_2$ to build up striated coatings with each layer being too thin for fibrous columnar growth to start.

We have found that by using our closed ring flux magnetron sputter ion plating system having a relatively high ion current density at the article to be coated we can create remarkable coatings, contrary to the teaching of Spalvins and Keem.

Preferably the coefficient of friction is 0.1 or less, and maybe 0.05 or less, and under some circumstances 0.005 or less.

$MoS_2$ is also notoriously bad in even slightly humid atmospheres. Our $MoS_2$ coating can operate successfully in normal air atmosphere. Our coating may have a coefficient of friction of about 0.02 when exposed to an atmosphere having 20% specific humidity, or 40% specific humidity.

In addition to producing pure, or substantially pure $MoS_2$ coatings we have found that by incorporating another metal, or metal from a second target, we get even better coatings. The metal in the molybdenum sulphur material may be selected from the group;

Titanium; zirconium; hafnium
tungsten; niobium; platinum
vanadium; tantalum; chromium; gold; molybdenum.

We have been able to achieve coatings which incorporate Titanium with a Vickers hardness of at least 1000, and with a Vickers hardness of at least 1500, and with a Vickers hardness of at least 2000.

The ratio of molybdenum plus other metal to sulphur of maybe about 1:2. The other metal may be dissolved in the $MoS_2$ crystal structure so as to have substantially no areas of elemental said other metal. The amount of said other metal may not be more than about 18% by weight (this is the figure for Titanium), but other metals may have different solubility in the $MoS_2$ structure and have other upper limits.

The coating is preferably substantially homogeneous. It is preferably substantially amorphous. The coating may be such that substantially no crystal grains can be seen using a transmission electron microscope at atomic resolution.

The coating may have Titanium also present and have a composition $Mo_xTi_yS_z$ where $x+y\approx 1$ and $Z\approx 2$, and where X is at least 4 times Y, and where the coating is a homogeneous amorphous coating showing substantially no crystal grain boundaries when viewed with a transmission electron microscope at atomic resolution, and which has a coefficient of friction of no more than 0.1, and which shows substantially no discrete elemental Ti. The coating in most embodiments is non-columnar and has no pores.

There may be an adhesion layer, or, interloper, beneath a molybdenum-sulphur layer. The adhesion layer may comprise a layer of Titanium or tungsten.

The coating may have an adhesion to a steel article of at least 70N. The coating may have a wear rate of less than $10^{-16}$ M$^3$/Nm, or of $10^{-17}$ M$^3$/Nm, or better.

We can provide much thicker coatings of $MoS_2$, or Mo/Ti/S than has previously been possible (with good hardness and wear rate). We can provide coatings with a thickness of 200–500 nm, or even up to 1000 nm or more.

According to a second aspect of the invention we provide molybdenum-sulphur-metal (Me) coating $Mo_xTi_yS_z$ wherein x+y is approximately equal to 1, Z is approximately equal to 2, Y is approximately 10% of X±9% of X, and wherein the coating is an unlayered coating with no crystal boundaries visible when viewed using a transmission electron microscope at atomic resolution, and wherein Me is a metal from the group: Titanium, zirconium, hafnium, tungsten, niobium, vanadium, tantalum, chromium and gold and wherein said coating has a Vickers hardness of at least 1,000, and which has a coefficient of friction of 0.03 or less in an air atmosphere of 10–20% humidity.

The coating may have a coefficient of friction of 0.1 or less in an air atmosphere with 20–40% humidity.

According to another aspect the invention comprises a Molybdenum Titanium Sulphur coating having no crystal boundaries visible when viewed at atomic resolution with a transmission electron microscope, and having an unlayered structure, and which when in an air atmosphere of 10–20 humidity has a Vickers hardness of at least 1,000 and a coefficient of friction of 0.03 or less, and a wear rate of $10^{-16}$ m/Nm or less.

The invention also comprises a dry machining tool, requiring no liquid lubricant to machine steel, the tool having a coating in accordance with any of the preceding aspects of the invention.

According to a further aspect the invention comprises a method of providing a molybdenum-sulphur coating on an article comprising operating a magnetron sputter ion plating system in an evacuation operation, followed by a backfill operation, followed by a cleaning operation, followed by a coating operation; said sputter system having a sputter chamber, a first target of $MoS_2$-sputter material to be coated onto said article, and a second, cleaning target of metal; and in which in said evacuation operation the pressure in said sputter chamber is reduced to lower than $5\times 10^{-4}$ torr; and in said backfill operation argon gas is allowed into said sputter chamber to a pressure of between $5\times 10^{-4}$ torr and $10^{-2}$ torr; and in said cleaning operation said second target is energised to produce a flux of reactive cleaning metal which reacts with impurities in said sputter chamber so as to remove them from having an active presence during the subsequent coating operation, and wherein during said cleaning operation a negative voltage is applied to said article to be coated such that, the size of the negative voltage applied to said article being sufficiently high, and the power applied to said second target being sufficiently low, ions from said second target bombard said article to be coated, but there is no net deposition of second target films on said article during said cleaning operation and in which during the coating operation the negative bias voltage on said article to be coated is reduced so that net deposition of material on the said article occurs, and wherein said molybdenum-sulphur coating deposited has an unlayered non-columnar structure.

Preferably, the coating has a hardness of at least 1,000VHN.

Preferably said metal target is energised during said coating operation to provide metal ions, and wherein the molybdenum-sulphur coating comprises metal held on the molybdenum-sulphur lattice to a concentration up to the solubility of said metal in the molybdenum sulphur lattice. Preferably said metal is Titanium and it is deposited in said coating so that the coating has up to 18% Titanium. During said cleaning operation a negative voltage of between 400V and 1,000V is preferably applied to said article to be coated. During deposition the negative voltage bias applied to the article is typically between 25V and 100V.

The invention also comprises a $Mo_xTi_yS_z$ coating having a thickness of at least 300 nm, and a Vickers Hardness of at least 1000, a wear rate of about $10^{-17}$ M$^3$/Nm or better, a coefficient of friction of about 0.02 or better in an air atmosphere with 20% humidity wherein $X\approx 1-Y$, $Z\approx 2$, y is in the range of 0–0.18, and wherein said coating is substantially homogeneous throughout its depth, and wherein the coating is a dense substantially unvoided coating having substantially no columnar structure.

According to a further aspect the invention comprises a $Mo_xTi_yS_z$ coating having a thickness of at least 300 nm, a Vickers hardness of at least 1000, a wear rate of about $10^{-17}$ M$^3$/Nm or better, a coefficient of friction of about 0.05 or better, wherein Me is a metal from the group: Titanium, zirconium, hafnium, tungsten, niobium, vanadium, tantalum, chromium, molybdenum and gold; and wherein $x\approx 1-Y$, Y is in the range 0 to 0.2, $Z\approx 2$, and wherein said coating is a dense substantially unvoided coating having substantially no columnar structure.

One way in which we achieve a good $Mo_xTi_yS_z$ coating (where $x+y\approx 1$ and $z\approx 2$ and Me=a metal such as Titanium, or Tungsten) is by the use of a second sputter target (or targets) as well as the metal/sulphur target (or targets) (e.g. metal sulphide such as $MoS_2$ or $WS_2$).

The target (or targets) can be of any metal but is preferably a highly reactive metal such as Titanium. In the following a Titanium target is referred to. The sputter electrodes can be simple diodes, RF electrodes or magnetrons, but magnetron electrodes are preferred.

During the ion cleaning of the substrates which normally precedes the deposition process in the ion plating technique, and during coating we introduce the concept of energising the second target of (e.g.) Titanium.

We energise the Titanium target for two reasons. Firstly in order to be able to strike an intense discharge to the substrates at a low argon pressure so that we ion clean the substrates efficiently at low argon pressure. Secondly we energise the Ti target to mop up the water vapour which is absorbed by the $MoS_2$ target and also by the $MoS_2$ previously deposited on the chamber walls, and the sulphur compounds (e.g. $H_2S$) which remain in the chamber following previous depositions. This mopping up or gettering of the water vapour and sulphur compounds during the ion cleaning part of the process helps to create very good adhesion between coating and substrate. It also reduces contamination during deposition which can cause brittleness and other undesirable properties.

We also prefer to energise the Ti target during the coating operation which introduces some Titanium into the $MoS_2$ coating. We obtain an improvement in the adhesion of the coating which may be a function of the ion cleaning.

Since making the present invention we have become aware of some prior art (most of which are the results of an EPO search). The results of the search support the inventiveness of the present invention.

JP 3 014 227 is perhaps the most relevant document. This discloses a method of making semiconductor devices (a different field from low-friction coatings) in which a Titanium target is energised in an argon atmosphere cleaning stage of operation. The Argon atmosphere is cleaned in the sputtering chamber prior to sputtering on to an aluminium substrate. The document is concerned solely with purifying the argon gas, not the aluminium target (aluminium is not a source of contamination). In our invention the target to provide the coating ($MoS_2$) is a cause of the water vapour problem and a source of sulphur contamination. JP 3014227 does not have an ion cleaning stage of the system to bombard the substrate to be coated with ions prior to coating. It is not even an ion plating system (just sputtering, no ion plating acceleration of ions onto the substrate).

JP 3 014 227 does not envisage cleaning the substrate to be coated and the target of coating material with ion cleaning (prior to ion plating the substrate) in order to remove impurities associated with the target. Moreover, it does not suggest using its Titanium target to reduce the argon pressure necessary to ion clean (it does not ion clean). It does not energise the Titanium target during the coating operation.

DE-C-44 14 051 discloses a sputtering technique in which $MoS_2$ is deposited on an interlayer of either $Cr_3Si$ or Cr. It does not discuss ion cleaning or ion plating. It does not have a second target of metal (e.g. Titanium).

DD-A-20 28 98 discusses depositing $MoS_2$ on cutting tools, but does not discuss using a second metal target in impurity gettering stage, prior to ion cleaning a substrate before ion plating it, nor having a Ti target energised during coating and including Ti in the $MoS_2$ coating.

DE-A-3 516 933 recognises that the presence of water vapour in the argon atmosphere is deleterious and describes a way of removing it from the gas atmosphere, but is not concerned with removing impurities from a plating chamber.

JP-A-3 097 855 shows a way of purifying argon gas prior to introducing to its sputter chamber. If used on $MoS_2$ systems the purified argon gas would only be re-contaminated when it was introduced into the sputter chamber (because the $MoS_2$ in the chamber has water vapour impurities, and other sulphur impurities would exist in the chamber). JP-A-3 097 855 shows that although a problem had been appreciated they had not thought of the present invention. Its effect is similar to DE-A-3 516 933 in this respect.

EP-A-0 534 905 is equivalent to CH 2893/91 referred to earlier, and merely discusses the desirability of $MoS_2$ coatings. It has little relevance to the present invention which is concerned with being able to provide good coatings with repeatability and fewer inconsistencies. It does not discuss having Titanium in the coating.

U.S. Pat. No. 5,002,798 is concerned with depositing. $MoS_2$ coatings, but was a totally different technique: it is not magnetron sputter ion plating, and does not include Titanium in the coatings.

FR-A-2 586 430 discusses the desirability of low friction coatings on article such as skis, and using vapour phase deposition techniques, but does not discuss magnetron sputter ion plating, or ways of reducing impurities in $MoS_2$ coatings.

U.S. Pat. No. 5,268,216 is specifically in the field of $MoS_2$ coatings and teaches the perceived impossibility of achieving thick non-fibrous/columnar $MoS_2$ and teaches building up a thick coating of $MoS_2$ using repeated thin layers to avoid producing a pored structure. We now are able to do what Keem and Spalvins (referenced earlier) thought was not possible.

According to one aspect of the invention we provide a sputter system having a first target (or targets) of metal sulphide (e.g. $MoS_2$ or $WS_2$) and a second target (or targets) of metal (e.g. Ti or W).

Preferably the first target is a metal disulphide. Preferably the metal second target is made of Titanium.

The first and second targets are each separately energisable (e.g. each have their own associated magnetron, which have independently controllable power supplies).

Preferably the arrangement is such that the system is capable of being activated in a cleaning operation in which the second target is energised. The first (e.g. $MoS_2$) target can be energised but is preferably not energised during the ion cleaning operation.

Preferably the first target comprises a magnetron with a target element, as may the second target. The, one, or both, magnetrons may be unbalanced.

In a MSIP system the cleaning operation involves the bombardment of the substrates by ions (usually argon ions) and in the new arrangement also involves the bombardment of the second target with ions so as to produce metal neutrals and ions in the sputter chamber, the metal neutrals and ions react with any impurities in the atmosphere of the chamber so as to remove them from the atmosphere. The metal neutrals and ions may adhere to the walls of the chamber. For example, water and sulphur in the coating chamber atmosphere react with the metal, preferably Titanium, created from the second target, to form stable and non-contaminating compounds, during the cleaning operation. The ion bombardment, and the metal atmosphere created in the cleaning operation, help to react deposits of impurities left over from earlier coating operations. This improves the efficiency of the ion cleaning of the substrate and improves the quality of coating that is laid down.

At least some of the reactive cleaning metal may be ionised metal, but the metal is not necessarily ionised. It could simply be sputtered metal. In one embodiment the reactive cleaning metal is partially ionised (perhaps about 5% ionised). Preferably the second target is Titanium or alternative reactive metal. The first and/or second targets may have a respective associated magnetron.

The method may include having some of the metal of the second target incorporated into the layer that is deposited on the substrate to be coated.

The method may include introducing to the sputter chamber in the coating operation a further material which is incorporated in the coating. The further material is preferably gaseous at its point of introduction and may be nitrogen, or oxygen, or a hydrocarbon gas.

Water and/or sulphur in the sputter chamber atmosphere reacts with the metal, preferably Titanium, created from the second target to form stable and non-contaminating compounds during the cleaning operation.

According to an aspect of the invention we provide an article coated using the system of the first aspect of the invention, or using the method of a second aspect of the invention.

According to another aspect the invention comprises the use of second target of metal in a cleaning operation of a sputter system so as to reduce impurities in a low-friction coating subsequently produced from the system.

According to another aspect the invention comprises the use of a second metal target in a cleaning operation of a sputter system for the production of a low friction metal-sulphur, e.g. $MoS_2$ coating with improved mechanical properties.

Preferably the coating is between 0.1 $\mu$m and 10 $\mu$m thick, preferably about 1 $\mu$m thick.

According to another aspect of the invention we provide a method of reducing impurities when using a magnetron sputter ion plating system to coat an article with a metal sulphide coating having a target of metal sulphide to produce the coating and a second, different, metal target, and energising the second target in a cleaning operation before coating commences, the second target a) producing reactive metal neutrals and ions which getter impurities in the ion plating chamber and also b) facilitating the generation of an intense discharge at low inert gas pressure (in the ion plating chamber) to achieve better ion cleaning of the substrate to be coated than would be achieved if there were no energised second target.

We may provide a method of reducing contamination of a coating laid down by a magnetron ion plating system on a substrate using a first target of material to be deposited that attracts impurities (e.g. water vapour) comprising ion cleaning the substrate and the first target in an ion cleaning operation, prior to a deposition/coating operation, and wherein in the ion cleaning operation a second target of good gettering material is energised to create gettering neutrals or ions of said material which ions or atoms clean the system.

Our coating system may comprise a first sputter source and second sputter source, the first and second sputter sources being arranged close to each other so that they can sputter simultaneously on to substrates situated in front of the two sputter sources, the first and second sources being of different materials so as to produce coating fluxes of different materials that deposit on to the substrates simultaneously to produce a coating of an approximately homogeneous mixture of the two materials on the substrates.

FIG. 4 schematically illustrates such a system.

The substrates can be on a moving holder so that they are brought into and moved out of the coating position. The movement is preferably rotary.

It has been found that the coatings produced by the above described methods have a coefficient of friction that is consistently below 0.1, and frequently as low as 0.02.

The method is preferably applied to MSIP, and most preferably CFUBMSIP.

Preferably the movement is rotation of the substrate about an axis. Preferably the axis of rotation does not pass through the substrate, Alternatively it may pass through the substrate.

BRIEF DESCRIPTION OF THE DRAWINGS

Embodiments of the invention will now be described be way of example only with reference to the accompanying drawings of which.

PREFERRED EMBODIMENT OF THE INVENTION

It will be appreciated that FIGS. 7 to 16 show only an example of the significant improvements obtained with the present invention, and that FIGS. 1 to 6 show one version of our coating machine.

Figure 1:
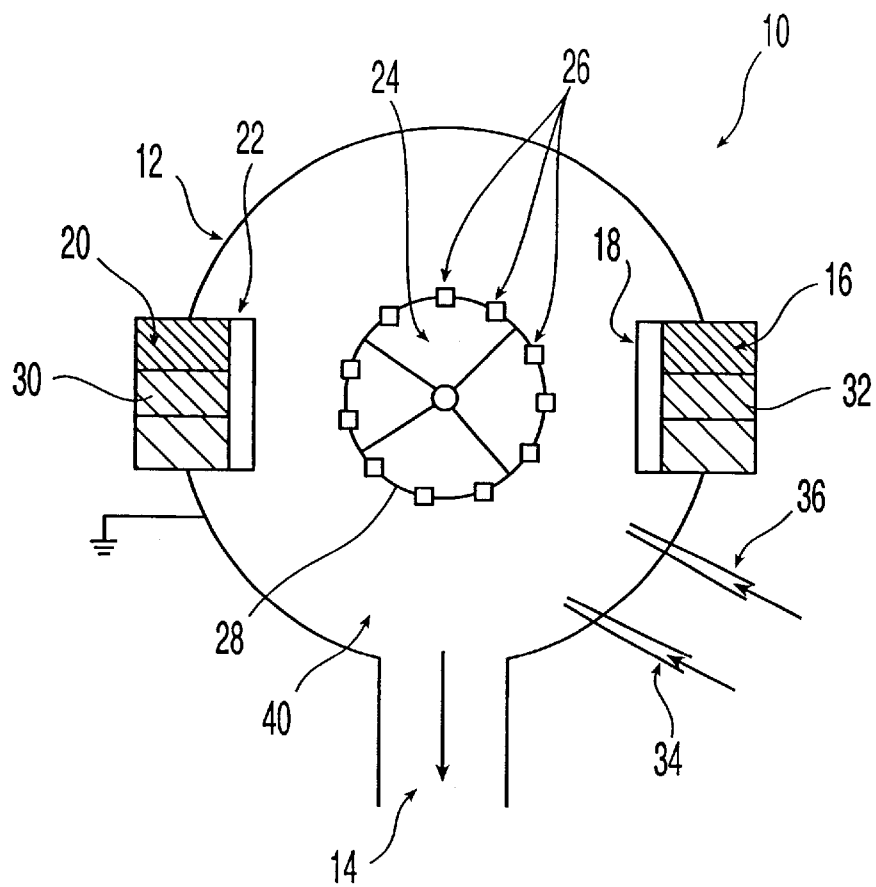
FIG. 1 shows a CFUBMSIP system having a target of $MoS_2$ and a Titanium target.

FIG. 1 shows an unbalanced magnetron sputter ion plating system 10 having a coating or sputter chamber 12, a pumping port 14, a first magnetron 16 having a $MoS_2$ target 18, a second magnetron 20 having a Titanium target 22, a rotatable component holder 24 holding substrates 26 to be coated, and power supplies 28, 30 and 32 for the substrate bias, and first and second magnetrons respectively. There are also two further valved ports 34 and 36 for reactive and non reactive gases respectively.

The preferred deposition method of using the apparatus of FIG. 1 is magnetron sputter ion plating and the increase of ion current density produced by using closed field unbalanced magnetron sputter ion plating (UK Patent GB 2 258 343 B) gives improved coating properties. The standard CFUBMSIP is modified and improved by the use of the second target of Ti (or other reactive metal) 30 which is used to getter the impurities in the coating system and to deposit Ti during the deposition of the $MoS_2$ (now $Mo_xTi_yS_z$) coating.

The following describes a typical deposition process, which should be taken only as an example.

The chamber, referenced 40, is evacuated to a pressure lower than $5 \times 10^{-4}$ torr and preferably to lower than $5 \times 10^{-5}$ torr and then is backfilled with argon gas to a pressure of between $5 \times 10_{-4}$ torr and $10^{-2}$ torr and preferably $2 \times 10^{-3}$ torr. A negative voltage of between 400 and 1000V is applied to the substrates 26 (via the holder 24) and a power of between 50 and 1000W is applied to the Titanium target(s) of dimensions 300 mm×125 mm. Larger targets would require proportionately more power. The substrates are rotated at a speed between 1 and 10 rpm.

This ion cleaning stage continues typically for 10 minutes or more.

For the deposition stage the substrate bias voltage is reduced to a value between floating potential and 75 volts negative and the power to the Titanium target(s) is set to a value up to 1000W but preferably to 250W and the power to the $MoS_2$ target(s) is set to about 300W. The power to the $MoS_2$ targets is not critical and is normally set as high as possible without causing damage to the target. Substrate rotation continues at between 1 and 10 rpm during the deposition stage. Deposition continues typically for between 15 minutes and 60 minutes but if thicker coatings are required the coating period is increased.

Between the ion cleaning and deposition stages as described above the sequence can be modified to include the deposition of a thin layer of Titanium. This can help improve adhesion of the coating.

During the deposition stage nitrogen can be introduced to the chamber so as to incorporate nitrogen into the coating.

Figure 6:
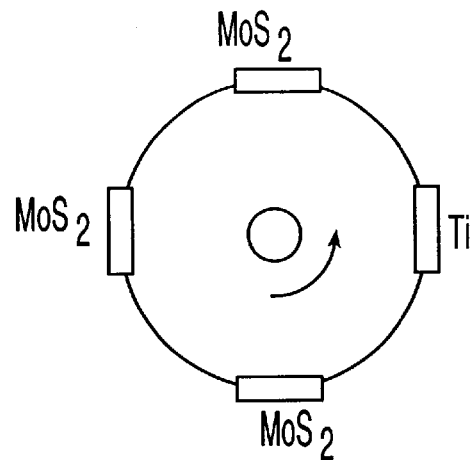
FIG. 6 shows another arrangement with three $MoS_2$ targets and one Titanium target.

We prefer in practice at present to use the apparatus of FIG. 6, and the above description should also be considered to apply to the arrangement of FIG. 6 where possible.

The deposition method used above is, as will be appreciated a standard magnetron sputter method (MSIP) method or a CFUBMSIP method, with the following exceptions:

During the ion bombardment cleaning of the substrates the Titanium sputter target is energised at a low power. For instance using a target size 12"×4" a target current of between 0.1 and 0.7 amps would be used and preferably the current would be 0.1 or 0.2 amps. In another example a current of 2.0 amps or 3.0 amps also enables the method to work.

During the ion closing stage the bias voltage applied to the substrates is sufficiently high to prevent net deposition of Titanium onto the substrates and would typically be above 500 v negative. The bias during ion cleaning can be DC, RF, AC, or pulsed DC. The Titanium sputtered from the Titanium target deposits on the chamber walls and reacts with any water vapour and/or sulphur or other contaminants present in the system to create a clean atmosphere for the ion cleaning and for the subsequent deposition.

The energised Titanium magnetron target also serves another purpose in that it allows a discharge to be struck to the biased substrate at a lower gas pressure than would be possible without the energised Titanium target. This is because of the effect of the magnetic field of the magnetron. Once the Ti magnetron has been energised its plasma provides electrons and ions which initiate (and maintain) the plasma at the substrate.

Following the ion cleaning stage deposition proceeds in the usual way by energising the $MoS_2$ magnetron target (or targets) at a power selected to give the required deposition rate (this power is not critical) and if a shutter has been used in front of the $MoS_2$ target, by opening the shutter. For the deposition the bias voltage on the substrates is reduced from that used during ion cleaning, so that net deposition can take place. The substrates can be earthed, floating or at a bias voltage between the floating voltage and 200 volts negative, but are preferably at a voltage of about 45 volts negative. The bias can be DC, RF, AC or pulsed DC. Energising the Titanium target during deposition of the molybdenum-sulphur layer now creates a molybdenum-sulphur-Titanium layer. The bias voltage can be reduced after the power to the Titanium target is switched off so that only a $MoS_2$ layer is deposited. The bias voltage can be reduced when the Titanium target is energised and before the $MoS_2$ target is energised so that a layer of Titanium is deposited prior to the $MoS_2$ coating. During this stage it is also possible to inlet Nitrogen into the system so that a layer of TiN is deposited prior to the $MoS_2$ $Mo_xTi_yS_z$) coating.

The Titanium target remains energised during the deposition of the $MoS_2$ so that a mixture of Titanium and $MoS_2$ is deposited. The Titanium content can be between 0 and about 20% but preferably would be about 10 wt %. It is found that the $MoS_2$/Titanium mixtures can have as low a coefficient of friction as $MoS_2$ but with improved mechanical properties and wear resistance.

During this stage it is also possible to maintain a flow of nitrogen gas so that a mixture of Titanium Nitride and $MoS_2$ is deposited. The TiN content can be between 0 and 40% but preferably would be 10% or less. It is found that the $MoS_2$/TiN can have as low a coefficient of friction as $MoS_2$ but with improved mechanical properties and wear resistance.

Thus the possible coatings are:
1. $MoS_2$ directly on the substrate.
2. (usually thin) layer of Ti followed by a $MoS_2$ coating.
3. (usually thin) layer of TiN followed by a $MoS_2$ coating.
4. A (usually thin) layer of Ti followed by a mixture of $MoS_2$ with up to about 20% Titanium ($MoS_2$/TiN layer).
5. A (usually thin) layer of TiN followed by a mixture of $MoS_2$ With up to 20% or 40% TiN ($MoS_2$/TiN layer).
6. A mixture of $MoS_2$ with up to about 20% Titanium directly on the substrate.
7. A mixture of $MoS_2$ with up to 20% or 40% TiN directly on the substrate.
8. A layer (usually thin) of TiN followed by a layer of $MoS^2$.
9. A layer (usually thin) of TiN followed by a layer of $MoS_2$/Ti.

In all cases the ion cleaning takes place with the Titanium energised.

Coating numbered 4 is usually considered best by us. The Titanium in the above description may possibly be replaced with any metal that also getters the impurities to the extent necessary to achieve a significantly improvement performance, and or/which influences the properties of $MoS_2$, when incorporated, to create better properties.

The nitrogen in the above description can be replaced with oxygen or a hydrocarbon gas or mixtures of these gases.

The substrate in the above description can be of any material and can include a substrate already coated with another material.

The $MoS_2$ or $MoS_2$/Ti or $MoS_2$/TiN coatings can have thicknesses from very thin, 0.1 µm or less to very thick, 10 µm or more, but would preferably be about 1 µm. The very thin coatings still give good performance because of the high wear resistance of the coatings. The very thick coatings are useful because the wear rate is approximately uniform throughout the thickness of the coating and therefore they can give very long lives. This is totally unlike $MoS_2$ deposited by earlier methods where most of the thickness of thick coatings would wear away very quickly and only the last thin coating, about 0.25 µm, would provide any useful, wear resistance.

The $MoS_2$/Ti mixture deposited as described above has very good tribological properties, with significant improvements over previous $MoS_2$ coatings.

The co-deposited coatings can be deposited by simultaneous deposition from a $MoS_2$ target and a neighbouring Titanium target to produce a coating consisting of a mixture of $MoS_2$ and Ti(or TiN). (See FIG. 4). There may be an ion cleaning Titanium target and a separate co-depositing Titanium target, or they may be the same target.

Alternatively and preferably the coatings can be deposited in a typical Closed Field Unbalanced Magnetron Sputter Ion Plating System (UK Patent GB 2 256 343 B) in which the substrates are rotated between magnetrons mounted around the substrate rotation axis.

Figure 5A:
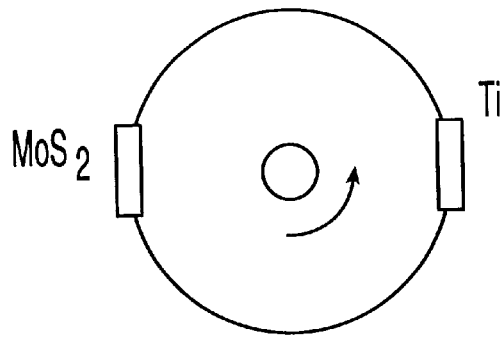
FIGS. 5A to 5C show schematically possible arrangements of dissimilar source electrodes.
Figure 5B:
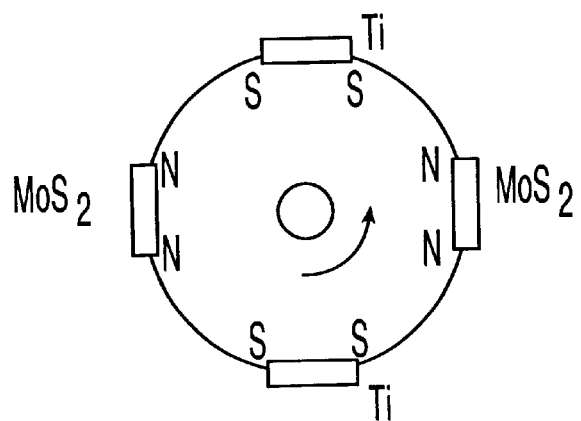
Figure 5C:
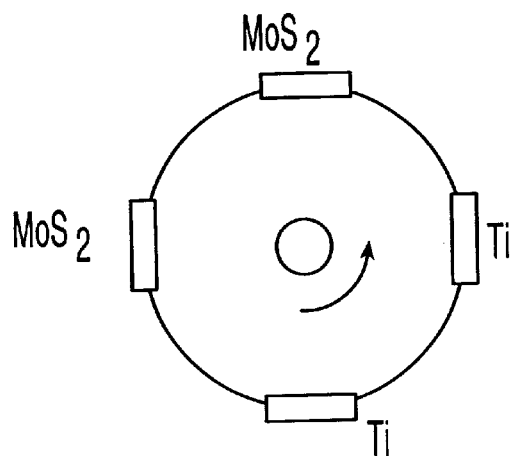

Three possible arrangements are shown in FIGS. 5a to 5c. A fourth arrangement is shown in FIG. 6.

Normally the maximum safe power is applied to the $MoS_2$ target (or targets) in order to obtain the maximum deposition rate. The maximum safe power is normally about 250W on a 300 mm×125 mm target. Although higher powers are possible they can cause cracking in the rather brittle $MoS_2$ target.

It has been found that the coatings produced by the above described methods have a coefficient of friction consistently below 0.1 and frequently as low as 0.02.

There may be more than one "second" target. They need not necessarily be of the same metal.

It will be appreciated that in the foregoing we could have more than one molybdenum sulphide source. We could have more than one metal source (e.g. more than on Ti source, or a source of one metal and another source of a different metal).

Whilst it might theoretically be possible to replace the $MoS_2$ (or the like) source with uncompounded sources of the elements we are not aware of such a system working and we would envisage having one or more metal-sulphur compound sources.

We have used the UBMSIP system described in UK Patent GB 2 258 343 B to produce very good coatings of $MoS_2$. We believe that the high ion content density at the substrate to be coated (greater than 1 $mA/cm^2$) and the low bias voltage of the substrate to be coated (typically 45 V negative) are factors in the production of good coatings, but they may not be essential. The coating is adherent and has a dense coherent structure. The general tribological properties are extremely good and the coatings also give improved cutting tool performance for several work piece materials, and allow high speed machining, unlubricated or with minimal lubrication.

We coated a high speed steel plate with $MoS_2$ using our system, with about 10% Titanium in the structure and the results of tests on the coated workpiece are given below:

Coefficient of Friction: generally 0.02. This is very low indeed. Humidity has only a slight effect on the friction.

Adhesion: The critical load Lc was greater that 70N. This is very high.

Hardness: Vickers Microhardness Tests indicate a hardness of over 1000Hv. This very high figure is confirmed by Nano Indentation tests.

Wear Resistance: The extreme wear resistance is indicated by ball on disc test results, using a 6 mm steel ball, a load of 80N and a linear speed of 5000 mm/min. Typically a 1 µm thick coating of $MoS_2$ on a tool steel substrate is not removed after 3 hours of running.

Figure 2:
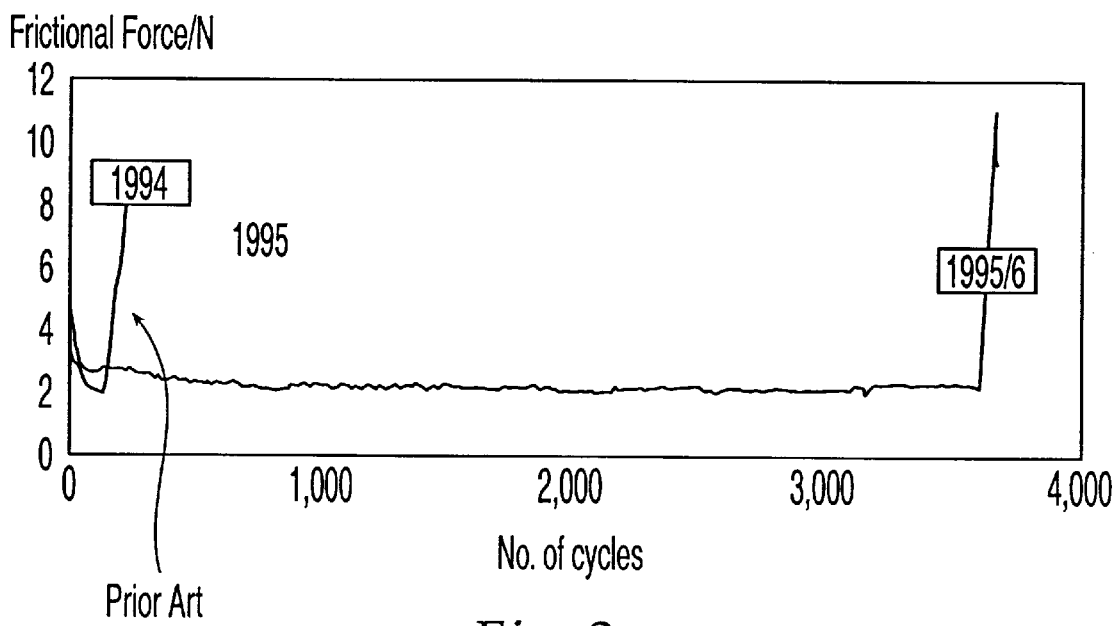
FIGS. 2 and 3 show test results on $MoS_2$ coatings.
Figure 3:
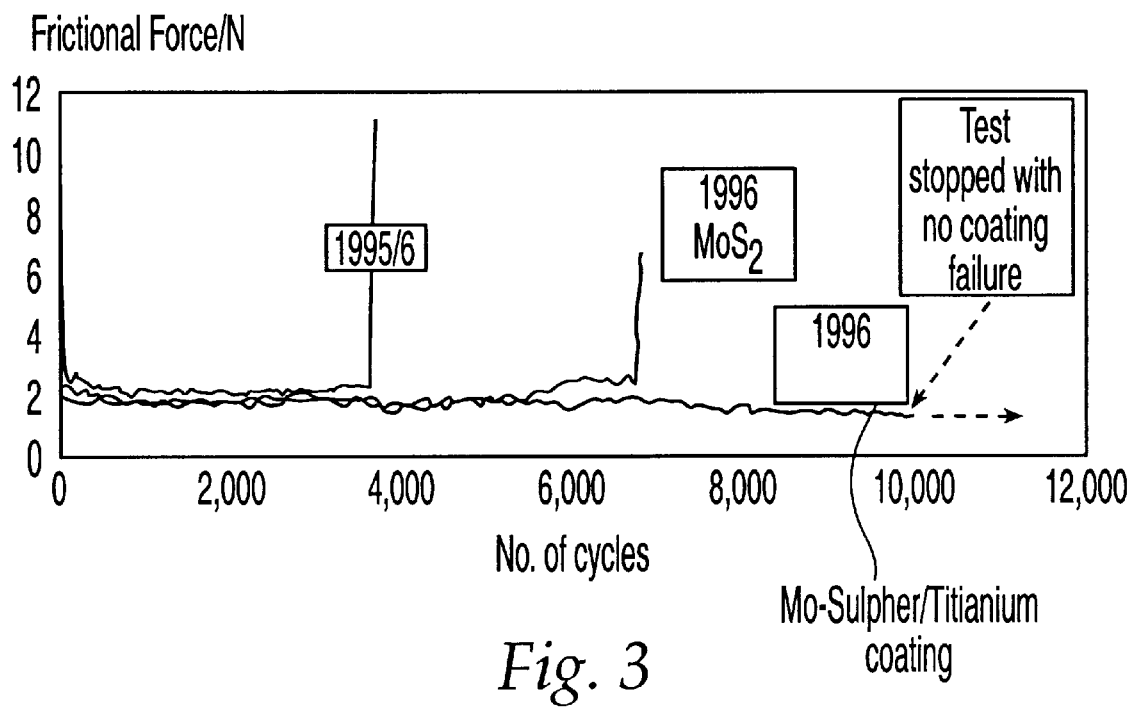
Figure 4:
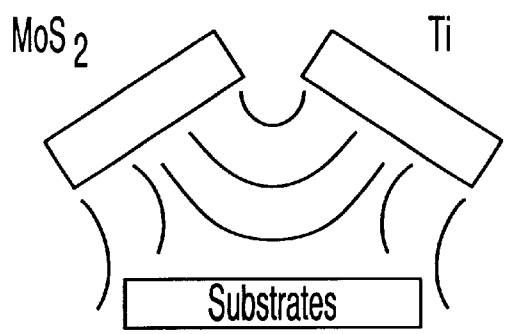
FIG. 4 shows schematically an arrangement of first and second magnetron electrode sources side by side.

FIGS. 2 and 3 show a comparison with some prior art $MoS_2$ coatings we have produced. The tests were performed using a Teer ST-2200 reciprocating tester. The load was 100N on a 5 mm diameter WC-Co ball. The speed was 150 mm/sec with a half period of 1 sec.

It will be seen from FIGS. 2 and 3 that the life of the coating is considerably more than what we could achieve before the present invention, or than anyone else could achieve.

Tests also show an improvement in cutting tool performance when they are coated with our new $MoS_2$ coating. Drilling tests into Al 15% Si alloys give a life of uncoated drills of about 50 holes. The same HSS drills coated with our $MoS_2$/Ti coating produced over 700 holes without failure.

Many tests have been carried out on carbide cutting tools coated with TiN, TiAlN or other hard coatings followed by a $MoS_2$ coating. The work piece materials that were machined included cast iron, stainless steel, Al alloys, Mg alloys, and Nickel based alloys. Our $MoS_2$ coatings produced an improvement in life of at least a factor of two, but in many cases the improvement was much greater.

Significant improvements in performance have been recorded on drills, milling cutters, reamers, saw blades, and turning tools.

Similar improvements have found in relation to forming tools, such as dies and punches.

Improvements have been found in other components such as bearings, gears, automobile engine components, control valves, and other general machine parts.

Our coatings work well unlubricated—as dry solid film lubricants. This may enable us to eliminate (or reduce to a very low level) the lubricants normally used in machining operations. This can reduce the cost of machining and has beneficial environmental effects. Our $MoS_2$ coatings which have the properties described above are believed to be new and inventive in their own right. They may have a Titanium, or other metal, content. The Titanium or over metal content may be 0%, ½%, 1%, 1½, 2%, 2½%, 3%, 3½, 4%, 5% or higher (by percent of number of atoms in the coating layer). The Titanium content may be about 20% or less, or 10% or less for $MoS_2$/Ti or $MoS_2$/TiN coatings.

The amount of Titanium (or other metal) can be increased beyond the limit of solubility of the Ti (other metal) in the $MoS_2$ in which case layers of elemental Ti occur in a multi-layer structure consisting of Ti/MoTiS/Ti/MoTiS, etc. As soon as elemental Ti occurs in the structure one observes that the tribological properties deteriorate and so these higher Ti contents are not recommended (about 18 wt % is the most we can achieve without elemental metal—for Titanium, other metals may have different solubility). However, these layered coatings are hard and can have better wear resistance than pure MoS$_2$ although friction is higher.

We can produce coatings that have a critical adhesion load of at least 50N, 60N, or at least 70N. The coefficient of friction may be 0.05 or less, or 0.02 or less. The Vickers hardness may be 500HV or more.

We have discovered a further inventive feature. Our MoS$_2$ coating deposited in a typical CFUMSIP system with substrate rotation is surprisingly hard—over 1000 Vickers. This is harder than high speed steel. MoS$_2$ coatings have previously been soft—it was possible to scratch them off with a fingernail.

There follows a discussion of our Mo$_x$Ti$_y$S$_z$ coatings.

Hardness

MoS$_2$ is normally very soft and powdery. Our MoS$_2$ deposited is not powdery but has a dense structure (non-pored, non columnar fibred) and as such is a big improvement over previous MoS$_2$ coatings. This we think is due to the intense ion bombardment which is a characteristic of the Closed Field System.

When we deposit a thin Ti layer prior to depositing the MoS$_2$ as above we also get exceptional adhesion. When we co deposit the MoS$_2$ and the Ti we produce a coating with a quite remarkable range of properties.

The hardness is difficult to measure accurately for these thin (1 $\mu$m) coatings. We found it difficult to believe some of the early results but we are now recording hardness of 2000VHN and these are supported by independent measurements from internationally recognised labs. Because it is still difficult to believe these results we are now confident of a hardness of it least 1000VHN. This is harder than the high speed steel used for cutting tools. The hardness tests used were standard Vickers microhardness tests and nano-indentation.

We wondered if we were producing multi-layered structures, but study revealed the presence of no multilayers even though the sensitivity was sufficient. No Ti was detected as a separate element either as a layer or as a precipitate or particle. Further tests have become more definite and all the investigators report that the coatings do not contain multi-layers or any elemental Ti.

We became satisfied that this was the case when we looked at sections through the coating using transmission electron microscopy (TEM) at a University. In this particular coating we had switched off the Ti for the last few minutes of the coating process so the final bit of the coating was pure MoS$_2$. It was possible to see the individual lattice planes in the MoS$_2$ structure at the surface, i.e. we had atomic resolution, but the rest of the coating was featureless. If multi layers had been present we would certainly have detected them.

Further we also produced a coating where we changed the coating parameters in order to ensure that we produced a multi layer. The TEM technique clearly showed the multi layers in this coating, proving that the technique was sufficiently sensitive. This coating that did contain multi layers had bad tribological performance.

Other analytical work was aimed at determining the structure of the coating rather than proving it was or was not a multi layer. We believe that we have a homogeneous structure consisting of Molybdenum and Titanium and Sulphur (when Ti is present). We have a structure based on MoS$_2$ but also containing Ti. It is probable that the Ti atoms replace some of the Mo atoms but this is not certain.

If we try to include too much Ti (or other metal) in the structure then we do produce multi layers and the properties are bad. In other words if we exceed the solubility of Ti (or other metal) in MoS$_2$ then the excess Ti appears in the coating as elemental Ti in a layered structure. This is how we produced the multi layer structure referred to above.

We have some results indicating the ratios of Mo:Ti:S but these are not yet conclusive but it is probable that the ratio of Mo+Ti:S is about 2.

The Mo—Ti—S is probably amorphous. The grain size is very small and has not been detected even using the TEM where we have demonstrated atomic resolution. We have never detected any crystalline structure within this coating.

The presence of the Ti in the MoS$_2$ lattice will cause strain within the lattice. This together with the fine grain/amorphous structure is our explanation for the high hardness, The level of hardness depends on the proportion of Ti in the structure and a hardness of 2000VHN corresponds to about 18% Ti. If we go much above this composition the Ti appears as elemental Ti and the properties are not good.

In our pure MoS$_2$ coatings, with no Ti, our explanation for the improved properties is the fact that we produce a non-pored, non-columnar structure thick layer of MoS$_2$, as opposed to the prior art fibrous voided structure. This explanation of the structure of our MoS$_2$ and Mo/Ti/S coatings is a theory only, and is consistent with the results we have obtained, but is not intended to be definitive or restrictive of the protection sought.

We might expect to obtain a multi layer since we are rotating the article being coated between a MoS$_2$ target and a Ti target. We believe that we do not get multi-layers because of the high solubility of Ti in MoS$_2$ and because of the high ion bombardment, characteristic of the CFUBMSIP technique, which will increase the mobility of the depositing atoms much as high temperature would increase this mobility. Thus even though the MoS$_2$ and the Ti coating fluxes are arriving periodically we believe that we still get a homogeneous composition because the Ti diffuses readily in the MoS$_2$. Whatever the exact reason, using the technique as described we do get this structure which has never been reported elsewhere, with properties that have not previously be achievable.

Coating Properties

Figure 7A:
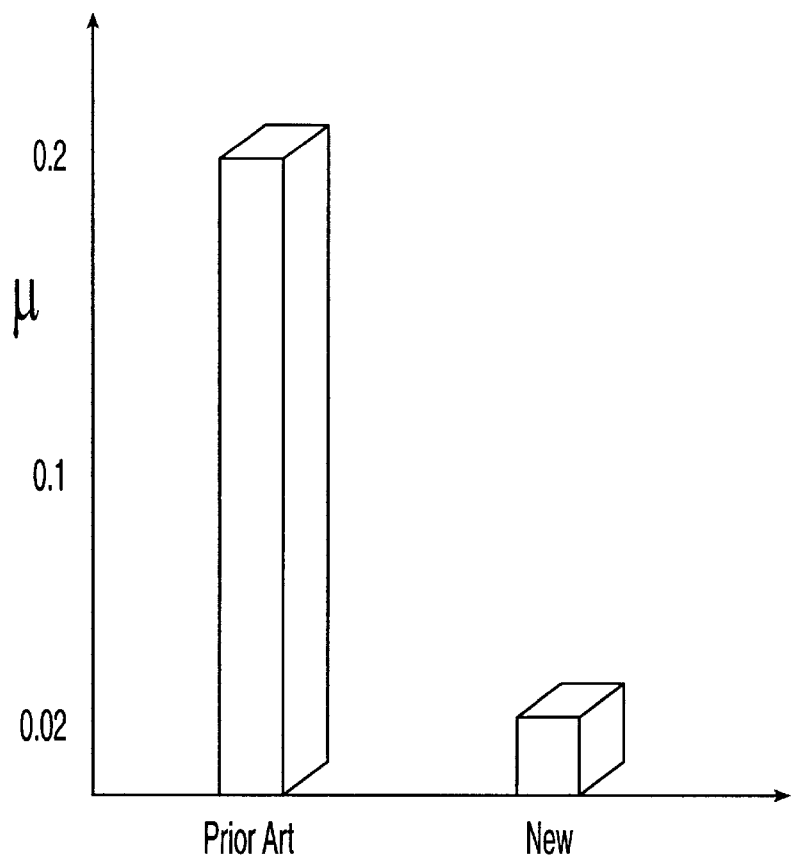
FIG. 7A shows schematically the relative coefficient of friction of our new molybdenum-sulphur-Titanium coating in comparison with known $MoS_2$ coatings, the comparison being made at high, e.g. 40%, atmospheric humidity.
Figure 7B:
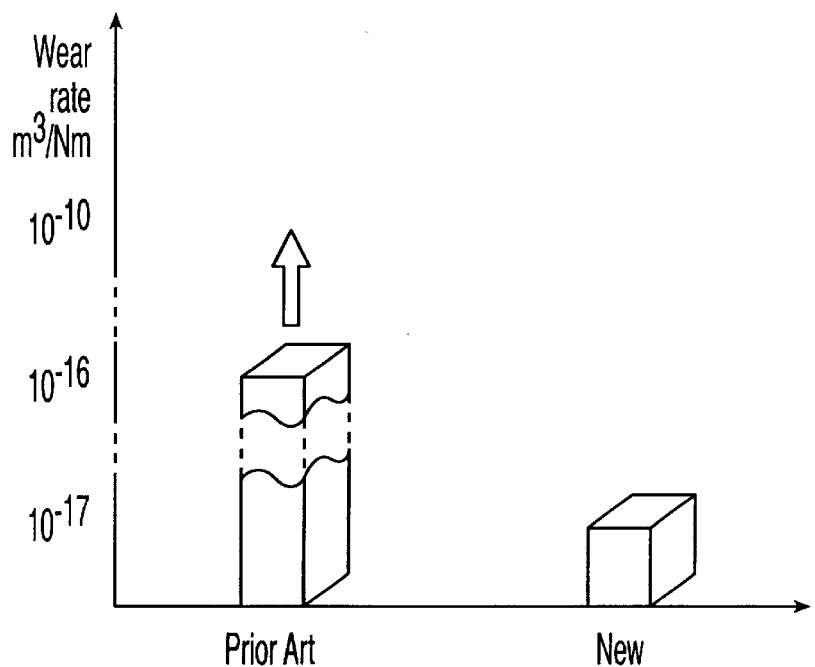
FIG. 7B shows schematically the dramatic improvement in wear rate of our new molybdenum-sulphur-Titanium coatings in comparison with known $MoS_2$ coatings.
Figure 7C:
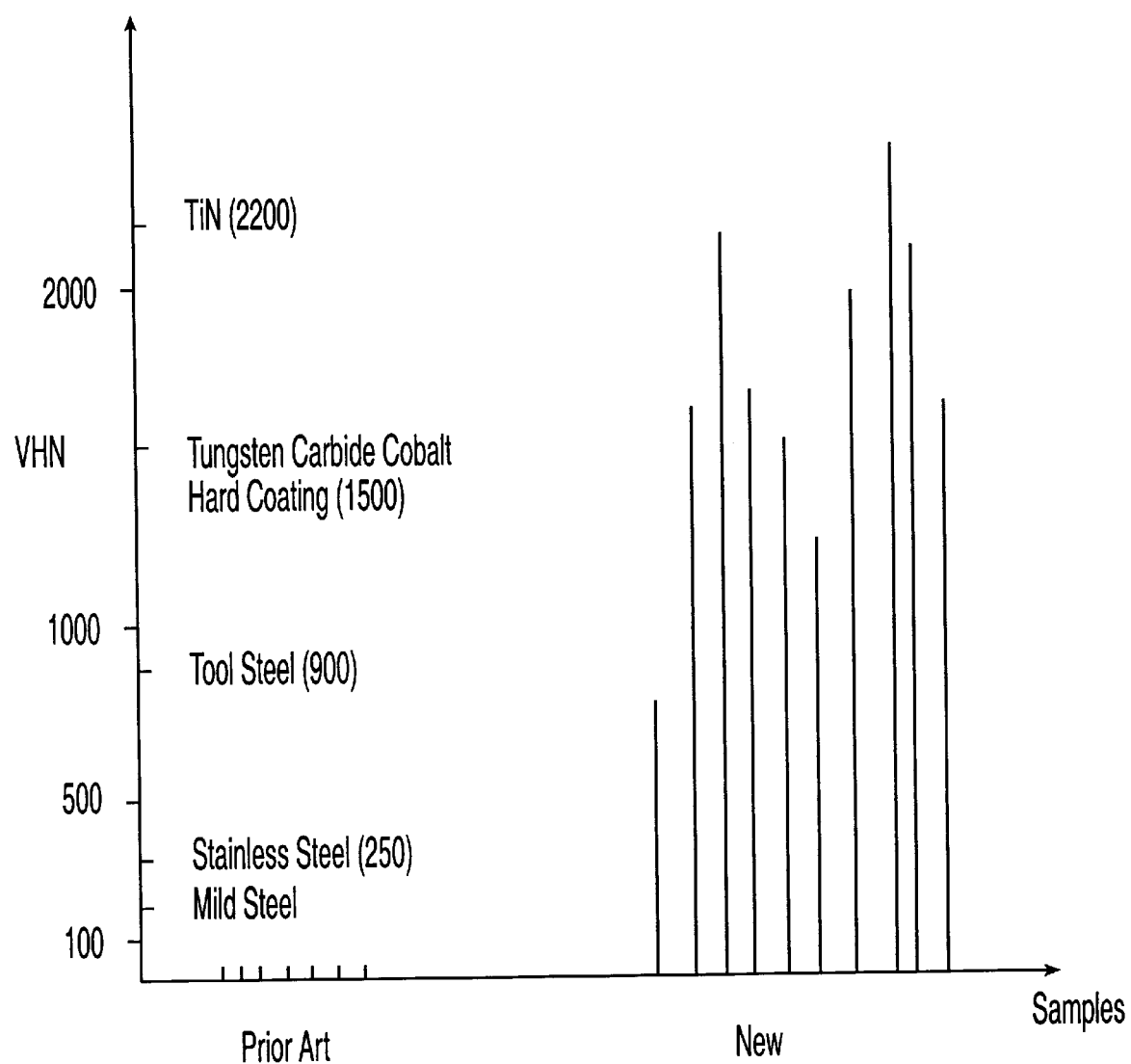
FIG. 7C shows schematically the dramatic improvement in hardness of our new molybdenum-sulphur-Titanium coating in comparison with known $MoS_2$ coatings.
Figure 9:
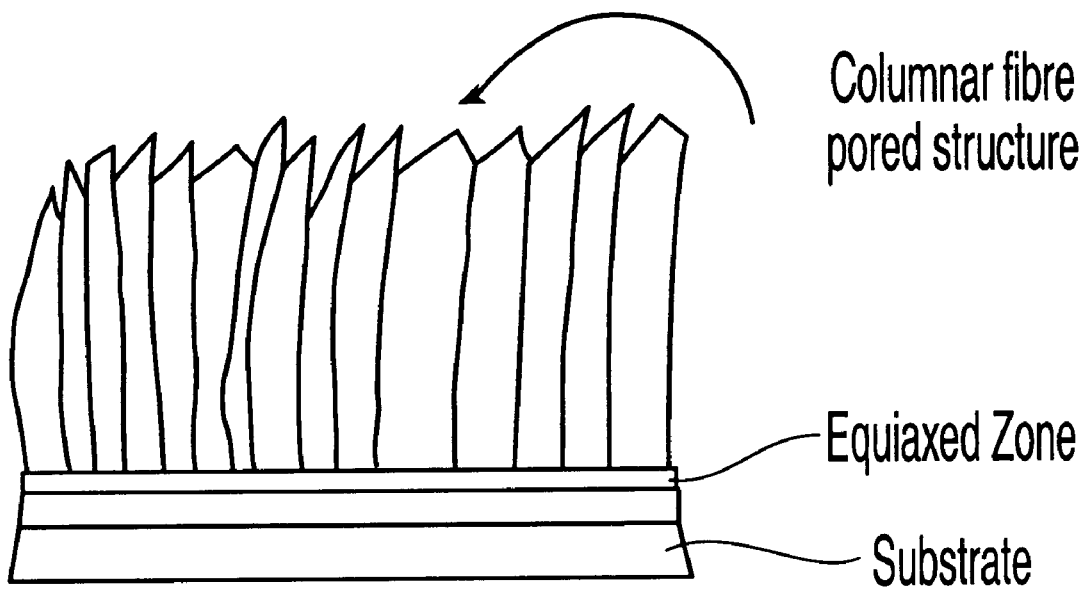
FIG. 9 shows a schematic side view of a prior art pored, voided, $MoS_2$ coating with fibre columnar structure.
Figure 10:
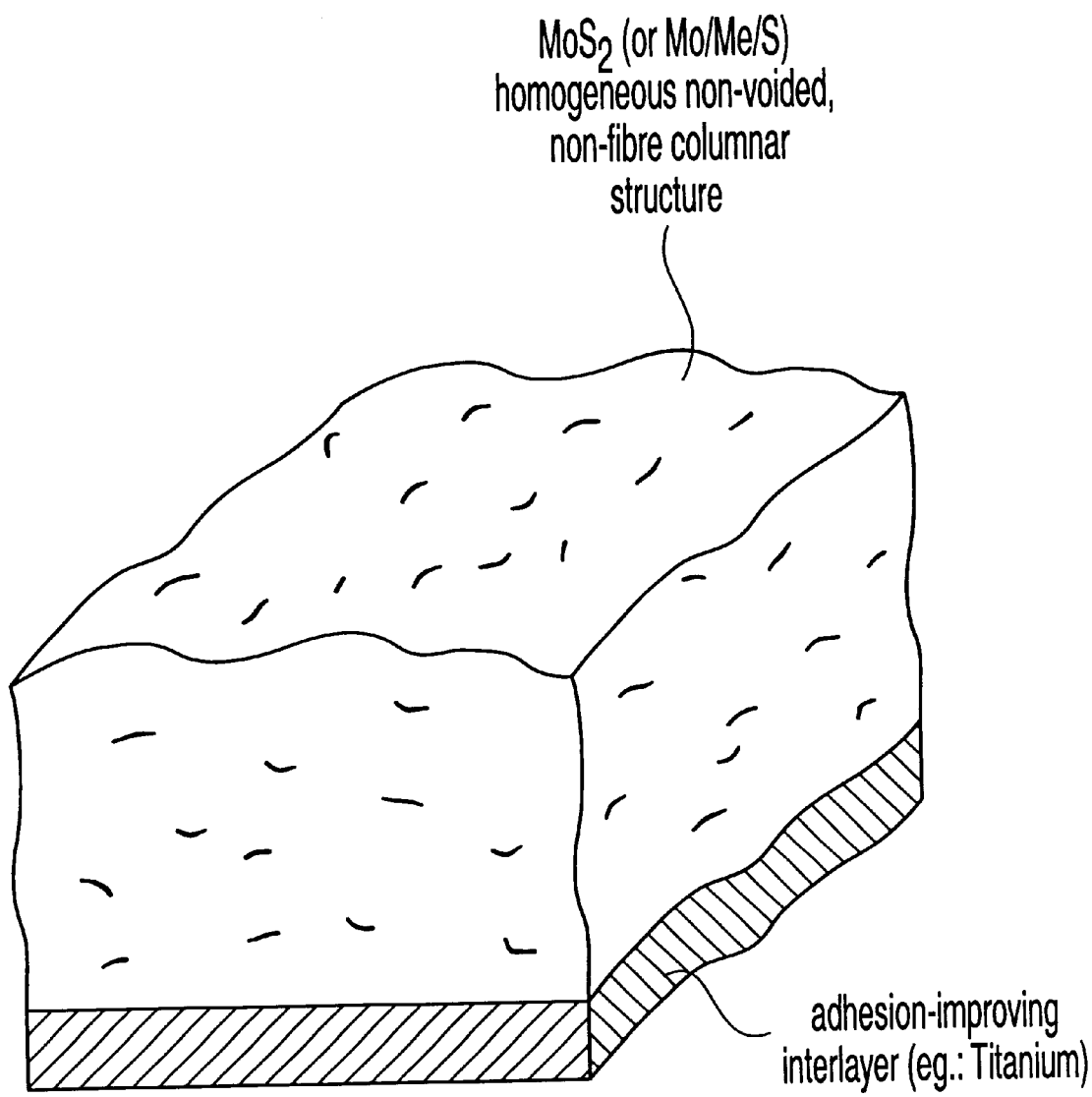
FIG. 10 shows a schematic illustration of our new thick non-fibrous, non columnar, non voided, coating.

FIG. 7C shows schematically typical hardness results and shows that our new coatings of Molybdenum-Sulphur-Titanium have a hardness one or two, orders of magnitude higher than known MoS$_2$.

Our Mo$_x$Ti$_y$S$_z$ coating, with x+y approximately equal to 1, Z approximately equal to 2, and with the Titanium content being about 5–15% by weight (and less than 20%) has a Vickers Hardness of over 1000VHN. That is harder than tool steel.

It has also been measured as being over 2000VHN. This is harder than the tungsten carbide composites used for cutting tools (1500VHN). It is nearly as hard as TiN (2200VHN) which is the most commonly used hard coating.

This contrasts strongly with conventional wisdom that MoS$_2$ is very soft indeed.

Friction

Our molybdenum-sulphur-Titanium coating has the same low friction as MoS$_2$ in dry atmosphere or vacuum. In a relative humidity of up to about 20% it retains substantially the same low friction. At higher relative humidities the friction rises slightly but is still well below 0.1 and our Mo—S—Ti coating can still be used as a low friction and low wear coating at more than 50% relative humidity.

This contrasts strongly with the conventional view that MoS$_2$ is for vacuum atmosphere applications, or very dry atmospheres.

FIG. 7A shows schematically the factor of 10 improvement over conventional $MoS_2$ in a humid atmosphere.

Wear

The wear properties are excellent. The load bearing capacity is high. We regularly use a pin on disc test at 100N load for our Mo/Ti/S coating with very low wear. $MoS_2$ would always fail rapidly at loads above 20N.

The wear rate is around $10^{-17}$ m$^3$/Nm. This is 10 times better than typical Diamond Like Carbon coatings which are currently the best low wear, low friction coatings and of course are very hard due to the diamond content in the coating (and is of course not an $MoS_2$ coating anyway). Molybdenum-Sulphur prior art coatings of substantial thickness do not have anything like a good wear rate—they are hundreds of times worse.

FIG. 7B shows schematically the extremely large improvement in wear rate.

Applications

Our new Mo/Ti/S coating is suitable for use in many rubbing and bearing type applications. These are very much the same type of applications where $MoS_2$ has previously been used but $MoS_2$ would be used only at high vacuum or in dry conditions. Our coating can be used in normal atmospheric conditions. Our Mo/Ti/$S_2$ coating can also be used at loads an order of magnitude greater than the loads used for $MoS_2$.

However the most remarkable applications for our Mo/Ti/S coating are in the metal cutting and forming field. In the majority of cases our Mo/S/Ti coating outperforms the best hard coatings that have been used previously.

Further, because our coating combines very low friction (about 0.02) with hardness and wear resistance it can now be used in dry machining applications. That it is possible in some circumstances to dispense with any coolant or lubricant when the tool is coated with our coating. Hard coatings such as TiN will not provide this performance. No other solid lubricant coating that we know of will provide this performance.

There now follows a discussion of some of our trials of our new Molybdenum/Titanium/Sulphur coatings. The coatings show friction coefficients as low as 0.02 in humid air (0.005 in dry $N_2$), hardness greater than 1500HV, and very low specific wear rate $4 \times 10^{-17}$ m$^3$(Nm)$^{-1}$).

Figure 11:
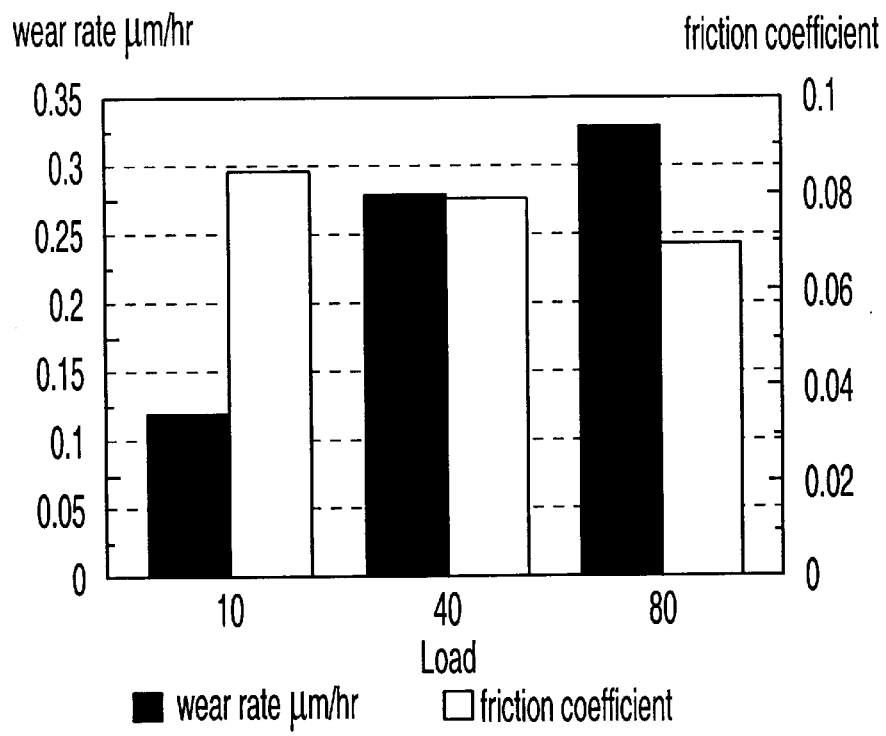
FIG. 11 shows a test result on an Mo/Ti/S coating with about 10% Titanium (by weight) in a pin on disc wear rate test.

Our Mo/Ti/S coatings show very low coefficients of friction and low wear rates, with the friction coefficient actually decreasing with increasing load. FIG. 11 shows this for Pin on disc test results (200 mm/s linear speed, 40% humidity, tests run for 60 min).

Our new Mo/Ti/S coatings have a very low specific wear rate of around $4 \times 10^{-17}$ m$^3$(Nm)$^{-1}$.

Compared to traditional $MoS_2$ coatings, our new coating shows a much greater load bearing capacity (it survives for 10,000 cycles in reciprocating wear tests at 130N load with only a third of the coating having worn away), and a much higher hardness (over 1500HV).

The use of the closed field unbalanced magnetron sputter ion plating system ensures that coatings are dense, coherent and adherent, with no coating failure evident up to 120N load in standard, scratch adhesion testing.

One of the major advantages of our new coatings over traditional $MoS_2$ coatings is the ability of the coating to perform in humid atmospheres. The majority of commercial $MoS_2$ coatings are recommended solely for use under dry or vacuum conditions. All of the results quoted for these trials have been obtained in atmospheres of between 40 and 50% relative humidity.

Performance Improvements using New Mo/Ti/S Coating

Perforating Operation

Figure 12:
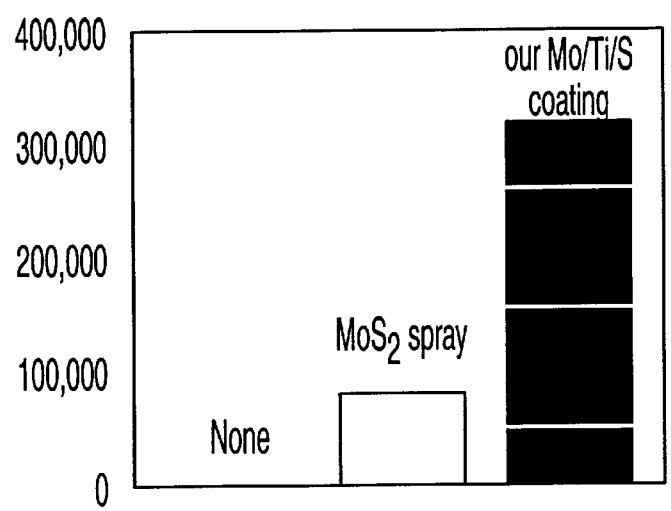
FIG. 12 shows the result of using a similar coating to that used in the test of FIG. 11 on steel punches (an increased life)

Coated steel punches were used to perforate 1.2 mm thick 409 stainless steel, unlubricated, at a rate of 250 pressings/minute. The results are shown in FIG. 12.

The punch coated with our new coating gave 320,000 pressings with no need for tool regrinding. Without the new coating the tool failed immediately.

In another perforating operation with a TiN+new Mo/Ti/S coating gave a 10-fold increase in tool life between re-grinds and prevented pick-up on tool shanks compared to just a TiN coating (which is a standard hard coating).

Coating Ejector Pins

Figure 13:
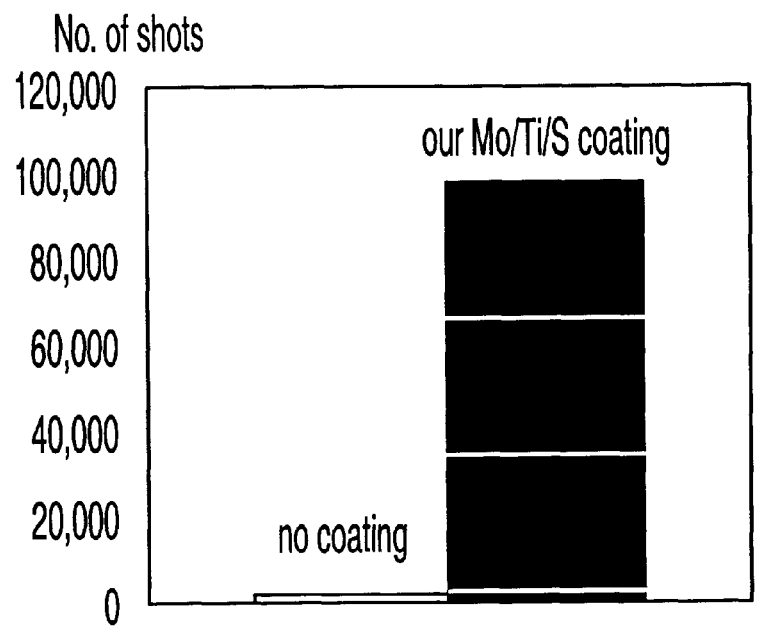
FIG. 13 shows the increase in life of ejector pins when they are coated with a Mo/Ti/S Coating.

Our Mo/Ti/S coating was used to coat the surface of ejector pins for plastic moulds. The results are shown in FIG. 13.

Uncoated pins were only able to produce 2,000 shots. With our new coating this was increased to 100,000 shots.

Drill Testing

Figure 14:
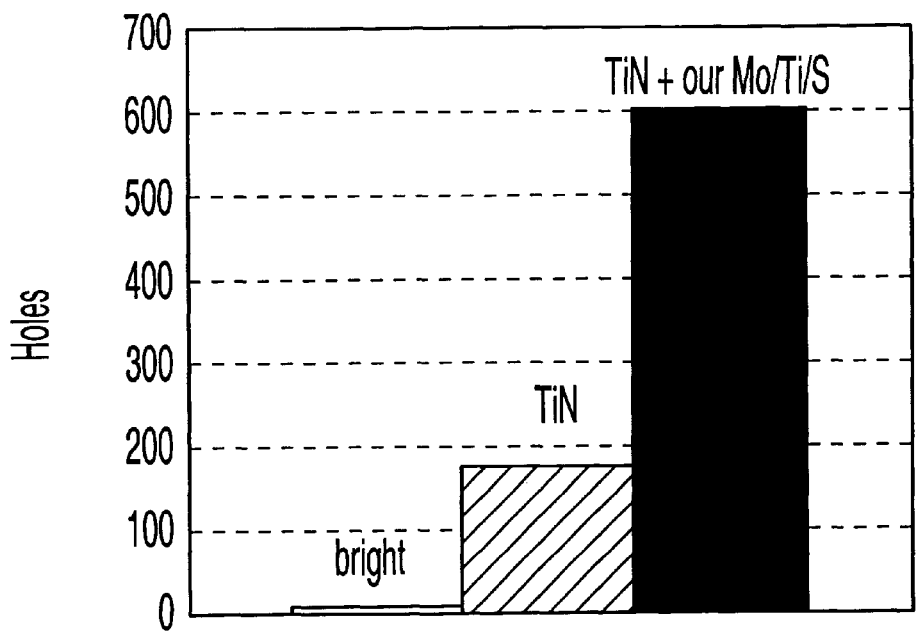
FIG. 14 shows the increase in life of TiN coated drill bits when further coated with our Mo/Ti/S coating.

¼inject jobber drills were coated with TiN and TiN+Mo/Ti/S. Test conditions: 2000 rpm, 25 mm blind holes, workpiece EN9 steel, feed rate 0.3mm/rev, weak flood coolant. The results are shown in FIG. 14.

Bright drills failed after 6 holes. With a TiN coating the drills failed after 173 holes, but using our new Mo/Ti/S coating on top of TiN produced 605 holes before failure.

Fineblanking Operation

Figure 15:
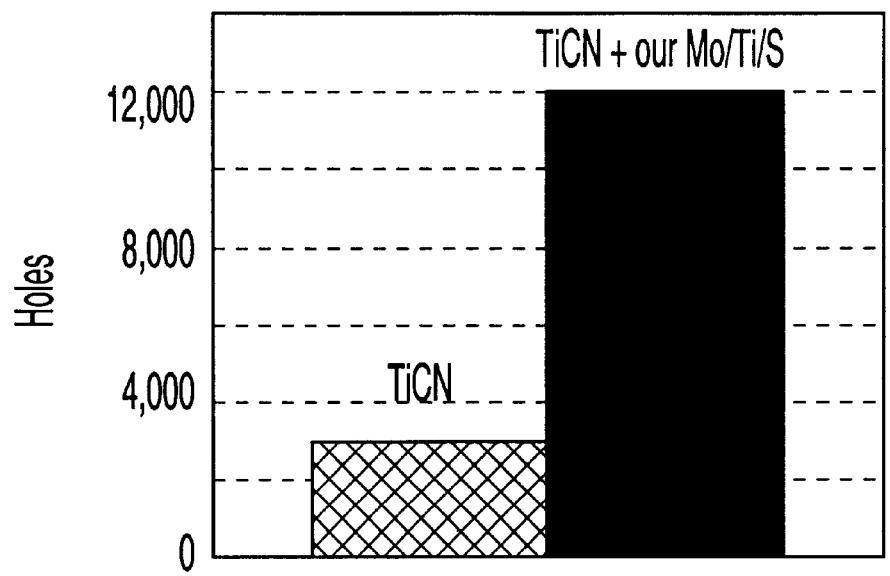
FIG. 15 shows an increased life of a fineblanking tool when its TiCN coating has our new Mo/Ti/S coating on top.

Using the new Mo/Ti/S coating on top of TiCN on a M2 tool for find blanking a 409 stainless steel workpiece (unlubricated) gave an improvement in the number of holes formed from 3,000 to 12,000. This is shown in FIG. 15.

Coining Dies

Figure 16:
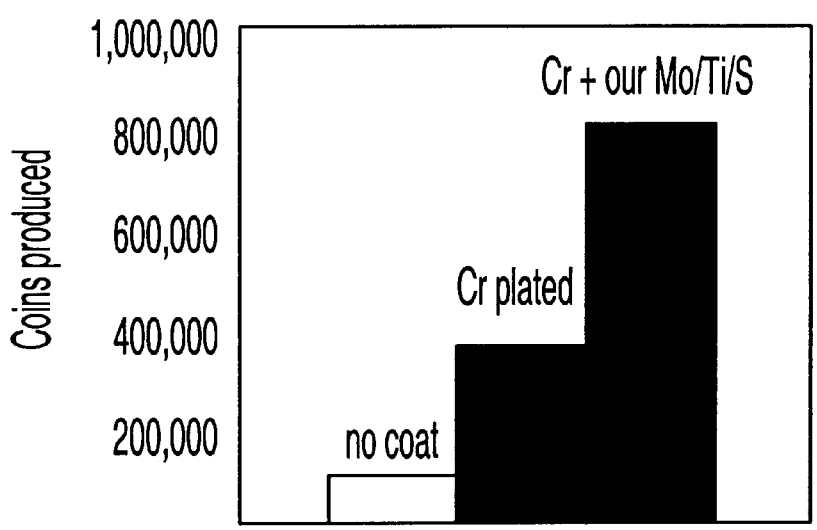
FIG. 16 shows the increase in life of coining dies when coated with our new $MoS_2$ coating (no Titanium).

A new $MoS_2$ coating that we deposited using our equipment was deposited on top of Cr plated coining dies and was compared to Cr plated dies, giving an improvement in the number of coins produced from 350,000 to 800,000. With no coating only 80,000 coins would be produced. This is shown in FIG. 16.

| Coating properties (Mo/Ti/S) | |
|---|---|
| Coefficient of Friction | between 0.02 (100 N) and 0.1 (10 N) at 45% humidity. Friction coefficient has been recorded as low as 0.005 in dry nitrogen. |
| Wear resistance | extremely low specific wear rate of $4 \times 10^{-17}$m$^3$(Nm)$^{-1}$ |
| Hardness | Vickers Microhardness tests indicate a hardness of above 1500 HV. This figure has been confirmed by nono-indentation tests. Tests of more recent coating indicate 2000 HV or more |
| Adhesion | critical load greater than 120 N |
| Structure | a dense non-columnar, quasi-amorphous, homogeneous solid solution of Ti in $MoS_2$ showing no evidence of multilayers |

Returning to our magnetron sputter ion plating system, we may have a third or further electrode(s)/magnetron(s) to provide a third (or further) component of another metal or alloy. The third (or further) magnetron may have a metal or carbon (or metallic semi-metal) target, or a compound (e.g. N,C, or O compound).

We may have a gettering electrode, a first coating material electrode and a second coating material electrode.

We prefer to have three $MoS_2$ electrodes and one Titanium electrode in a 4 magnetron UBMSIP system, with the magnetrons in the closed field arrangement as described in UK Patent GB 2 258 343 B.

Instead of Titanium we may use another reactive metals for example vanadium, zirconium, niobium, molybdenum, tantalum, hafnium, or tungsten. Unreactive metals, such as gold or platinum can be used as the third element in the coating.

It will be appreciated that a non-reactive metal will not work for the ion cleaning of the system, but can be used during the deposition (in addition to or, instead of the reactive metal).

Figure 8:
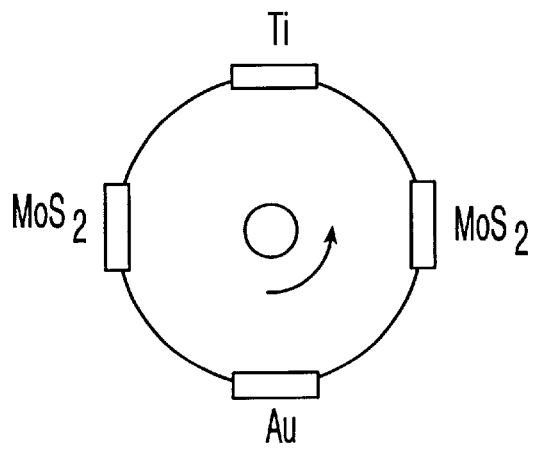
FIG. 8 shows a MSIP system having a reactive metal cleaning target, $MoS_2$ coating targets, and a gold coating target.

FIG. 8 illustrates a MSIP system, which will usually use unbalanced magnetrons, in which there is a reactive metal target (e.g. Titanium), two hexagonal layer lattice: targets (e.g. $MoS_2$), and a non-reactive metal target (e.g. gold). The substrate to be coated is rotated by a component holder. The system would preferably be a closed field system (UK Patent GB 2 258 343 B).

The reactive metal target is energised in the ion cleaning operation of the system to clean the system by producing gettering ions or neutrals which mop up impurities. During the coating operation there are different ways that the system can be operated.

Platinum is another non-reactive metal that gives good coating results.

Instead of, or in addition to the gold (or other non-reactive metal) target we may have a carbon target (or other "metallic" non-metal) and produce coatings having carbon layers.

The carbon layer may be deposited as diamond-like carbon. Such multi-layer coatings have also been found to have good hardness, adhesion, and low friction.

Instead of $MoS_2$ we may use any hexagonal layer/lattice material e.g. $WS_2$ or $TiS_2$. We may use $NbS_2$, $TaS_2$, $MoSe_2$, $NbSe_2$, $TaSe_2$, $MoTe_2$, $NbTe_2$, $TaTe_2$, or $WTe_2$, or mired compounds of any of the foregoing.

The coatings that we make may have a generally stoichiometric ratio of metal to non-metal (e.g. in $MoS_2$), or a non-stoichiometric ratio. We may produce a coating with less non-metal in it than the stoichiometric ratio (a sub-stoichiometric composition).

For example a molybdenum sulphur coating may be $MoS_2$ at the stoichiometric ratio or $MoS_x$ where X is above or below two. "X" may be about 1.5. X may be from 1.2 to 2.5.

Even if the target of $MoS_2$ is stoichiometric the coating need not be. We can get a variety of sub stoichiometric coatings in tests.

Thus where in the protection—defining claims of this application we refer to $MoS_2$ we mean molybdenum/sulphur composition having stoichiometric or non-stoichiometric composition.

It will be appreciated that the heart of the cleaning process is that during a normal deposition sequence the surfaces of the substrates are cleaning by ion bombardment. The ions are produced by applying a high (typically 1000V) negative bias to the substrates in an atmosphere of argon gas at a pressure of about $2 \times 10^{-3}$ torr. The argon ion bombardment is aided here by the operation of the second electrode which produces a flux of reactive metal into the chamber and which removes contaminants from the atmosphere in the chamber. We bombard the substrates using argon ions as in a conventional process, and the reactive metal flux from the 2nd electrode is cleaning up the atmosphere in this process and thus making it more effective.

What is claimed is:

1. A molybdenum-sulphur material low friction coating deposited on a substrate and having a thickness of at least 200 nm and a pore free homogeneous substantially non-columnar structure, the coating having a molybdenum-sulphur material and also having at least some other additional metal selected from the group titanium, zirconium, hafnium, tungsten, niobium, platinum, vanadium, tantalum, chromium, molybdenum, and gold, incorporated in it up to 18% by weight, wherein the coating has a Vickers hardness of at least 500 and the coating is an amorphous homogenous coating.

2. A coating according to claim 1 which has a coefficient of friction of 0.1 or less.

3. A coating according to claim 1 which has a coefficient of friction of 0.05 or less.

4. A coating according to claim 1 which has a coefficient of friction of about 0.02 when exposed to an atmosphere having 20% specific humidity, in addition to having a Vickers hardness of at least 500 at that humidity.

5. A coating according to claim 1 which has a Vickers hardness of at least 1000.

6. A coating according to claim 1 which has a Vickers hardness of at least 1500.

7. A coating according to claim 1 which has a Vickers hardness of at least 2000.

8. A coating according to claim 1 which has a ratio of molybdenum plus other metal to sulphur of about 1:2.

9. A coating according to claim 1 wherein said other metal is dissolved in the molybdenum-sulphur crystal structure so as to have substantially no areas of elemental said other metal.

10. A coating according to claim 1 in which no crystal grains can be seen using a transmission electron microscope at atomic resolution.

11. A coating according to claim 1 wherein there is at least some other metal in the molybdenum sulphur material, said other metal being soluble in the molybdenum sulphide material so that it is not present as islands of elemental metal.

12. A coating according to claim 1 wherein Titanium is also present and the coating has a composition $Mo_xTi_yS_z$ where $x+y \approx 1$ and $Z \approx 2$, and where x is at least 4 times Y, and where the coating is a homogeneous amorphous coating showing substantially no crystal grain boundaries when viewed with a transmission electron microscope at atomic resolution, and which has a coefficient of friction of about 0.1 or less, and which shows substantially no discrete elemental Ti.

13. A coating according to claim 1 which comprises an adhesion layer beneath a molybdenum-sulphur layer, the adhesion layer comprising a layer of titanium or tungsten.

14. A coating according to claim 13 which has an adhesion to a steel article of at least 70N.

15. A coating according to claim 1 which has a wear rate of less than $10^{-16}$ $m^{-3}$/Nm.

16. A coating according to claim 15 which has a wear rate of $10^{-17}$ $m^3$/Nm, or better.

17. A coating according to claim 1 in which the coating consists essentially of $MoS_2$ with said other metal incorporated in a form so as to have substantially no elemental metal regions in the coating.

18. An article coated with a molybdenum-sulphur coating of claim 1, which coating has a Vickers hardness of at least 500.

19. An article coated with a molybdenum-sulphur coating of claim 1, which coating has a coefficient of friction of not more than 0.05.

20. An article according to claim 19 wherein the coating has a thickness of at least 500 nm and a substantially uniform wear rate throughout its thickness.

21. An article according to claim 20 wherein the coating is substantially homogeneous throughout its thickness.

22. An article according to claim 21 wherein the coating has a thickness of at least 1 μm.

23. An article coated with a molybdenum-sulphur coating of claim 1, which coating has a wear rate of better than $5 \times 10^{-16}$ $m^3$/Nm.

24. A dry machining tool, requiring no liquid lubricant to machine steel, the tool having a coating in accordance with claim 1.

25. The coating according to claim 1 wherein the molybdenum-sulphur material is molybdenum sulfide.

26. A molybdenum-sulphur-metal (Me) coating $Mo_xMe_yS_z$ wherein x+y is approximately equal to 1, Z is approximately equal to 2, Y is approximately 1–19% of X, and wherein the coating is an unlayered coating with no crystal boundaries visible when viewed using a transmission electron microscope at atomic resolution, and wherein Me is a metal from the group: titanium, zirconium, hafnium, tungsten, niobium, platinum, vanadium, tantalum, chromium, molybdenum and gold that is added to a molybdenum sulfur material and wherein said coating has a Vickers hardness of at least 1,000 when in an air atmosphere of about 10–20% humidity, and which has a coefficient of friction of 0.03 or less in an air atmosphere of 10–20% humidity.

27. A coating according to claim 26 which has a wear rate of about $10^{-17}$ m$^3$/Nm or better.

28. A coating according to claim 26 which has a coefficient of friction of 0.1 or less in an air atmosphere with 20%–40% humidity.

29. A coated steel article according to claim 28 wherein a layer of Titanium is provided between said steel and said coating.

30. A coated steel article having a coating in accordance with claim 26, said coating adhering to the steel with an adhesion of at least 70N.

31. A Molybdenum Titanium Sulphur coating deposed on a substrate and having no crystal boundaries visible when viewed at atomic resolution with a transmission electron microscope, and having an unlayered structure, and which when in an air atmosphere of 10–20% humidity has a Vickers hardness of at least 1,000 and a coefficient of friction of 0.03 or less, and a wear rate of $10^{-16}$ m$^3$/Nm or less.

32. A $Mo_xTi_yS_z$ coating having a thickness of at least 300 nm, a Vickers hardness of at least 1000, a, wear rate of about $10^{-17}$ m$^3$/Nm, or better, a coefficient of friction of about 0.02 or better, the foregoing being exhibited in an air atmosphere with 0.20% humidity, and wherein Z≈2, Titanium is present in an amount up to 18% by weight, and wherein said coating is substantially homogeneous throughout its depth, and wherein the coating is a dense substantially unvoided coating and having substantially no columnar structure.

33. A coating according to claim 32 wherein Z is in the range 1.5 to 2.5.

34. A $Mo_xTi_yS_z$ coating having a thickness of at least 300 nm, a Vickers hardness of at least 1000, a wear rate of about $10^{-17}$ m$^3$/Nm or better, a coefficient of friction of about 0.05 or better, wherein Me is a metal selected from the group consisting of: titanium, zirconium, hafnium, tungsten, niobium, platinum, vanadium, tantalum, chromium, molybdenum and gold that is added to a molybdenum sulfur material; and wherein x≈1-Y, Y is being present in an amount up to 0.2, Z≈2, and wherein said coating is a dense substantially unvoided coating having no columnar structure.

35. A coated article having a coating of $Mo_xMe_yS_z$ where Me is a metal selected from the group consisting of: titanium, zirconium, hafnium, tungsten, niobium, platinum, vanadium, tantalum, chromium, molybdenum, and gold, that is added to a molybdenum sulfur material, and X is at least 4 times Y, the coating having a thickness of at least 300 nm, and having a wear rate of $10^{-17}$ m$^3$/Nm or better, a Vickers hardness of at least 1,000, a coefficient of friction of 0.05 or less, and which has the properties mentioned in an air atmosphere of 40% specific humidity.

36. A molybdenum-sulphur material low friction coating deposited on a substrate and having a thickness of at least 200 nm and a pore free homogeneous substantially non-columnar structure, the molybdenum-sulphur material also having titanium, wherein the coating has a composition $Mo_xTi_yS_z$ where x+y≈1, z≈2, and x is at least 4 times Y, and where the coating is a homogeneous amorphous coating showing substantially no crystal grain boundaries when viewed with a transmission electron microscope at atomic resolution, and which has a coefficient of friction of about 0.1 or less, and which shows substantially no discrete elemental Ti.

37. A molybdenum-sulphur material low friction coating deposited on a substrate and having a thickness of at least 200 nm and a pore free homogeneous substantially non-columnar structure, the coating consisting essentially of molybdenum sulphide and an additional metal selected from the group titanium, zirconium, hafnium, tungsten, niobium, platinum, vanadium, tantalum, chromium, molybdenum, and gold, incorporated in it up to 18% by weight, wherein the coating has a Vickers hardness of at least 500, and the coating is an amorphous homogenous coating.

38. The coating according to claim 37 which additionally comprises an adhesion layer disposed between the substrate and the coating, the adhesion layer comprising titanium or tungsten.

* * * * *